United States Patent [19]

Rajeevakumar

[11] Patent Number: 5,426,324
[45] Date of Patent: Jun. 20, 1995

[54] HIGH CAPACITANCE MULTI-LEVEL STORAGE NODE FOR HIGH DENSITY TFT LOAD SRAMS WITH LOW SOFT ERROR RATES

[75] Inventor: Thekkemadathil V. Rajeevakumar, Scarsdale, N.Y.

[73] Assignee: International Business Machines Corporation, Armonk, N.Y.

[21] Appl. No.: 289,155

[22] Filed: Aug. 11, 1994

[51] Int. Cl.[6] .................. H01L 27/02; G11C 11/00; G11C 11/34
[52] U.S. Cl. .................. 257/368; 257/301; 257/382; 257/532; 257/903; 365/182
[58] Field of Search .......... 257/368, 301, 379, 382, 257/393, 532, 622, 751, 773, 903; 365/182

[56] References Cited

U.S. PATENT DOCUMENTS

| | | | |
|---|---|---|---|
| 4,890,144 | 12/1989 | Teng et al. | 357/23.4 |
| 4,997,783 | 3/1991 | Hsu | 437/52 |
| 5,016,070 | 5/1991 | Sundaresan | 357/23.6 |
| 5,057,893 | 10/1991 | Sheng et al. | 257/903 |
| 5,145,799 | 9/1992 | Rodder | 437/47 |
| 5,179,033 | 1/1993 | Adan | 437/41 |
| 5,187,114 | 2/1993 | Chan et al. | 437/52 |
| 5,198,683 | 3/1993 | Sivan | 257/67 |
| 5,204,279 | 4/1993 | Chan et al. | 437/47 |

OTHER PUBLICATIONS

"High Density SRAM Structure with a New Three-Dimensional, High- . . . " J. P. Gambino et al IBM Tech. Disc. Bul. vol. 34 #2 Jul. 1991 pp. 255–258.
"High-Density CMOS SRAM Cell" W. H. Chang IBM Tech. Disc. Bulletin v. 34 #6 Nov. 1991 pp. 95–96.
"High Density Thin Film Transistor Load SRAM Cell Using Trench . . . " T. V. Rajeevakumar IBM Tech. Disc. Bul. v. 36 #09A Sep. 1993 pp. 581–582.

Primary Examiner—Mark V. Prenty
Attorney, Agent, or Firm—Robert P. Tassinari, Jr.

[57] ABSTRACT

A high capacitance multi-level storage node contact is proposed for high density SRAMs. The proposed contact connects several poly levels to diffusion and to a trench capacitor, in one contact. The high storage node capacitance provided by the trench capacitor substantially reduces the soft error rate probability of the cell. The use of a single contact to connect several levels reduces the area. The contact preferably uses TiN as a barrier layer to reduce dopant diffusion between different poly layers.

16 Claims, 7 Drawing Sheets

HIGH CAPACITANCE MULTI-LEVEL STORAGE NODE FOR HIGH DENSITY TFT LOAD SRAMS WITH LOW SOFT ERROR RATES

FIELD OF THE INVENTION

The invention relates to SRAM devices, and in particular to a multi-level storage node for such devices.

BACKGROUND OF THE INVENTION

As the SRAM cell is scaled towards the 64 Mb SRAM and beyond, innovative cell concepts are needed to push the cell area to practical limits. When the cell area is scaled down, the storage node capacitance is also reduced, resulting in higher soft error rates. Exposure to naturally occurring radiation can alter the charge stored at the storage (latch) node, and can change the data stored. Fast SRAMs require lower Soft Error Rates ("SER"), because fast dedicated caches tend to rely less on Error Correction Coding ("ECC"), which are required to compensate for high SER's.

Several schemes have been proposed in the past to reduce soft errors in SRAMs. One scheme involves the placement of a stacked capacitor between the input-/output and the latch nodes. (See, for example, patents U.S. Pat. No. 5,016,070 and U.S. Pat. No. 5,145,799.) However, such a capacitor increases the noise coupling between the input/output and the latch (storage) nodes, thereby increasing the noise susceptibility of the cell. In addition, the capacitance associated with the stacked capacitor is limited, and the stacked capacitor introduces planarization problems.

In accordance with the present invention, the soft error and other stability problems associated with the scaling down of SRAMs to higher and higher densities can be eliminated by placing a trench storage capacitor under each of the latch nodes, and connected to the latch nodes. The capacitor is between the latch node and the ground, and so does not increase noise from inputs. The node capacitance can be arbitrarily increased without increase in cell area by increasing the trench depth. Prior designs have placed a capacitance across the bitline access device in an attempt to reduce soft error rates. This technique has proven to be ineffective, however, because high frequency noise can pass from input/output through such capacitors, resulting in errors. In accordance with the present invention, however, because device stabilization is achieved through a capacitance connected to ground, where no such high frequency noise exists, better cell stability is achieved.

In addition, a novel multi-layer contact proposed here reduces the cell area.

SUMMARY OF THE INVENTION

The present invention is an improved SRAM cell having a trench formed in a substrate, the trench containing a capacitor. A first diffusion area is provided in the substrate adjacent the capacitor, and a first gate node is disposed on the capacitor. A second diffusion area is provided in the substrate spaced from the first diffusion area, and a second gate node contacts the first and second diffusion areas. A third gate node contacts a portion of the second diffusion area. A contact is disposed on the second diffusion area and is electrically isolated from the first and second gate nodes. An insulating layer is provided on the first, second and third gate nodes, the contact and the exposed surface of the substrate. A polysilicon gate layer is formed on the insulating layer, and a polysilicon body is formed on the gate layer. A vertical contact electrically connects the storage node to each of the first diffusion area, the first gate poly node, the polysilicon gate layer and the polysilicon body.

Each latch node in an SRAM cell has one such multi-level contact, meaning two such contacts and capacitors per SRAM cell.

FIGURES

DETAILED DESCRIPTION OF THE INVENTION

Figure 1:
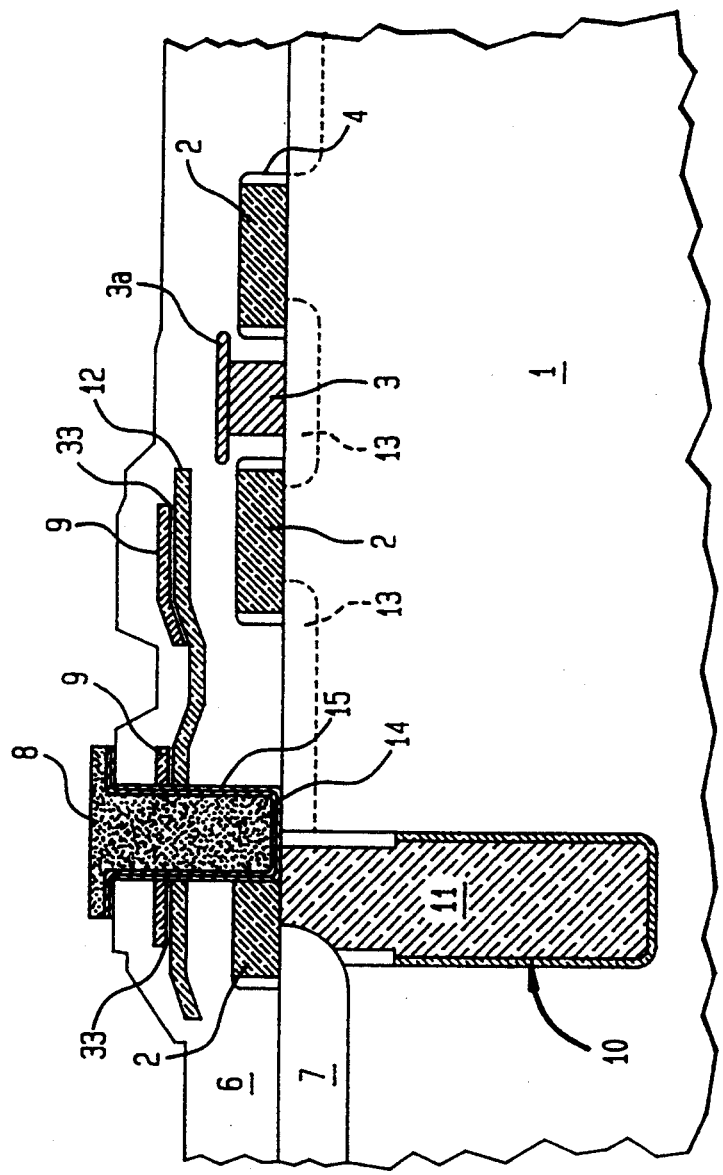
FIG. 1 is a schematic vertical structure of one latch node of an SRAM cell according to the invention.

FIG. 1 is a schematic vertical structure of one node of an SRAM cell according to the invention, showing one of the multi-level poly-diffusion-trench contacts in such a cell, as well as a capacitor between the latch node and ground to reduce soft error rates. The cell cross-section of FIG. 1 includes substrate contact 1, multilevel poly-diffusion-trench contact 8, gate poly 2, ground contact 3, ground line 3a, oxide spacer 4, deposited oxide 6, LOCOS ("LOCal Oxidation of Silicon") isolation 7, TFT ("Thin Film Transistor") body poly 9, capacitor dielectric 10, trench poly node 11 inside the capacitor dielectric 10, TFT gate poly 12, diffusion 13, $TiSi_2$ layer 14, and TiN layer 15.

Substrate 1 is preferably a p+ silicon substrate with a p− epitaxial layer near the surface. The p− layer is advantageous because it allows formation of n diffusion region 13 through a later diffusion step. Alternatively, substrate 1 can be an n+ silicon substrate with an n− epitaxial layer near the surface, allowing p diffusion.

In accordance with the present invention, multilevel contact 8 connects: (1) the trench capacitor node 11, (2) the diffusion 13, (3) the gate poly 2, (4) the gate poly 12 of the PMOS load TFT, and (5) the body poly 9 of the PMOS load TFT (100 in FIG. 14). In one preferred embodiment, the hole occupied by contact 8 has an inner lining of $TiSi_2$ and TiN layers 14 and 15. The contact itself is made from either polysilicon, or a metal such as Tungsten or Aluminum. Tungsten is the preferred material. The TiN and $TiSi_2$ layers provide good electrical contact between the contact 8 and the various elements described above while providing a diffusion barrier to prevent any dopant diffusion from one poly layer to another (for instance from body poly 9 to gate poly 12). TaN can be used in place of the TiN layer, although TiN is preferred.

Figure 14:
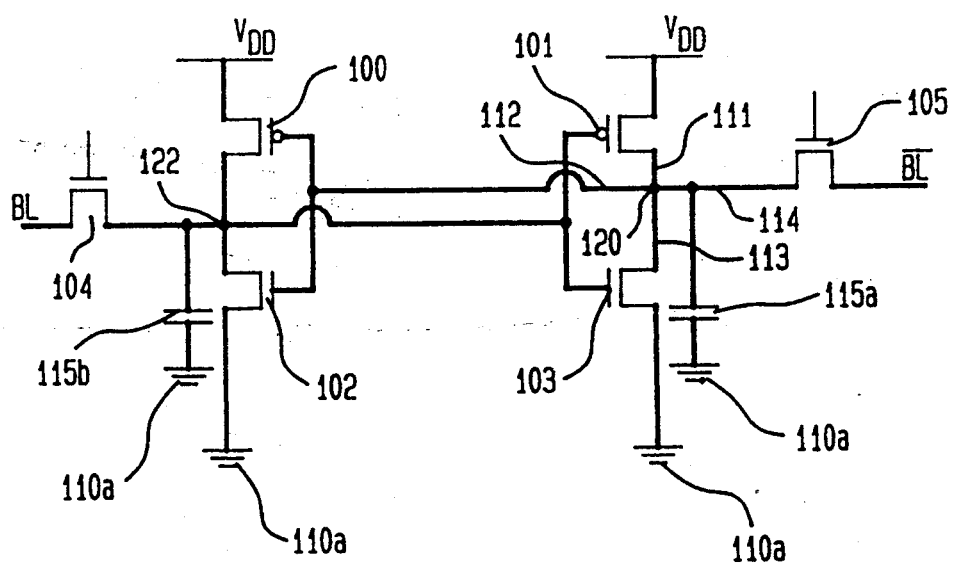
FIG. 14 is a schematic diagram of the electrical circuit formed by the device of the present invention.

Each of the gate polysilicon layers 2 provide, in a preferred embodiment, a separate gate for the four n-channel devices of the cell shown in FIG. 14. Ground contact 3 of FIG. 1 corresponds to ground contacts 110a and 110b in FIG. 14. Ground contact 3 is made from tungsten, aluminum or other metal, although tungsten is preferred.

Spacers 4 protect the poly gate from contact with other logic devices. These spacers preferably are about 200 angstroms in thickness.

Deposited oxide 6 insulates layer 12 from contact 3, poly gate 2 and the silicon surface 1.

LOCOS isolation layer 7 electrically isolates diffusion 13 from other diffusion areas.

TFT body poly 9, along with TFT gate poly 12 form transistor 100 in FIG. 14. TFT gate poly 12 also acts as the gate for transistor 101 of FIG. 14.

Capacitor dielectric 10 provides capacitance for the trench between polysilicon node 11 and poly contact 1 (ground), to provide electrical (charge) stability for the latch nodes of the cell. The high capacitance introduced by the dielectric 10 (which can be oxide, silicon nitride or a composite of the two) ensures that the amount of charge associated with each latch node is comparatively much higher than any amount of radiation-induced noise charge collected by the latch node. This stability of charge, therefore, ensures stability of the cell. A thicker capacitor dielectric 10 may be used to increase the reliability. The thickness of layer 10 preferably is approximately 50–80 angstroms. The storage node capacitance of layer 10 preferably will be between 30 fF to 100 fF, depending on the trench depth and the thickness of the capacitor dielectric. While only one storage node and latch node with a multi-level contact between them are shown in the figure for convenience, it will be understood that an SRAM cell will have two such nodes.

An alternative way of adding capacitance is to provide a capacitor after cell processing, for instance by providing a ground plane above contact 8.

The collar 31, consisting of a thick oxide, protects the oxidized surface of the capacitor trench from degradation during processing.

Figure 2:
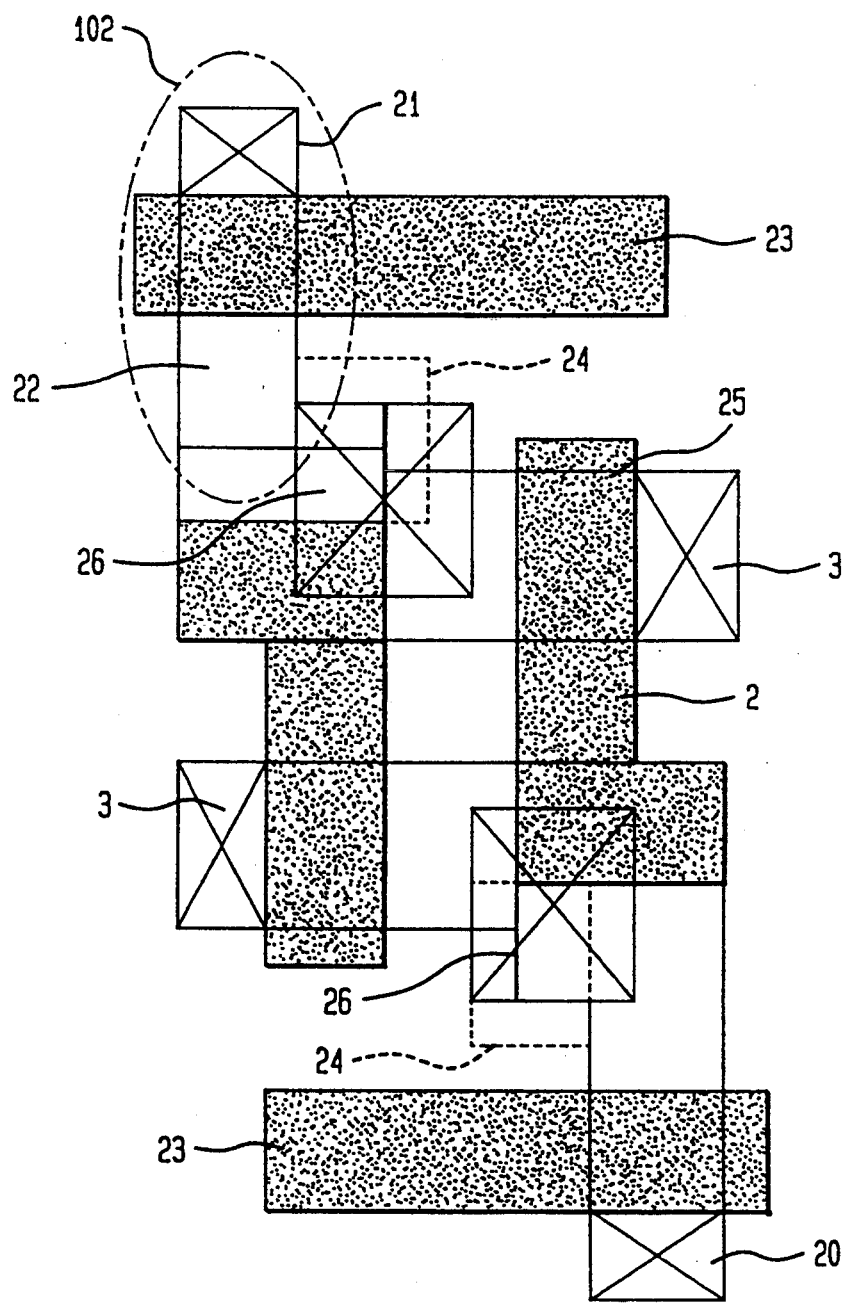
FIG. 2 shows a top view (layout) of the SRAM cell of FIG. 1.

FIG. 2 shows a top view (layout) of the SRAM cell of FIG. 1. The gate and body of the TFT are not shown, for reasons of clarity. The top view shows word line 23, diffusion area 22, bitline 20, complementary bitline 21, trench 24, NMOS driver 25, and poly-diffusion-trench contact 26. The contact 8 in FIG. 1 corresponds to contact 26 in FIG. 2. The cell is symmetric, with split word line layout. The ground contact 3 and the bit line contacts 20 and 21 can be made borderless to gate poly 2. A resistive region may be formed in the diffusion 22 between the poly-diffusion-trench contact 26 and the access transistor 102 to reduce the cell ratio for stable low voltage operation.

A cell area of about 40 lithographic squares may be achieved for the type of cell layout shown in FIG. 2. A preferred method of fabricating the structure of FIGS. 1 and 2 is now described.

Figure 3:
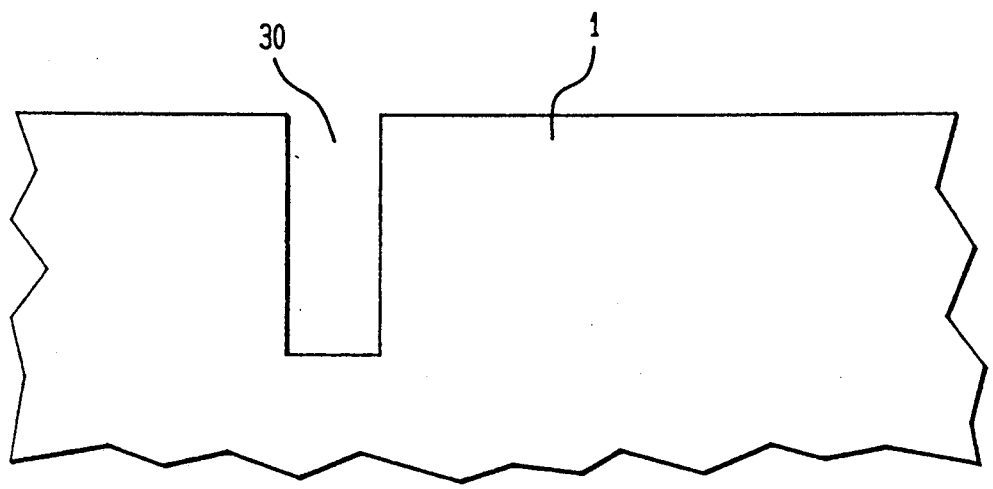
FIGS. 3-7, 8, 8a and 9-13 show the sequential process steps for fabricating an SRAM cell in accordance with the present invention.
Figure 4:
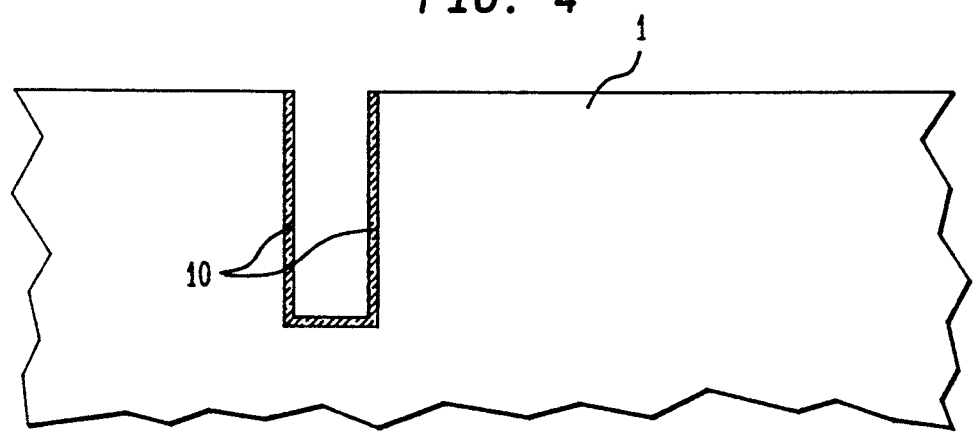

Referring to FIG. 3, first the trench capacitor is formed using conventional methods. For this, a trench 30 is etched (preferably using reactive ion etching, RIE) in substrate 1 to an appropriate depth, depending upon the size of the opening and the desired capacitance. In a preferred embodiment, the depth will be approximately 10 microns for a 0.5 micron opening.

Next is the formation of capacitor dielectric 10 inside the trench. This capacitor dielectric is formed as follows. The dielectric is preferably a three layer composite. First, the trench is oxidized by introducing oxygen into the trench. Next, nitrogen is introduced at high temperature to form silicon nitride. Finally, a silicon nitride is oxidized to form a composite layer of oxide-nitride-oxide (ONO).

Figure 5:
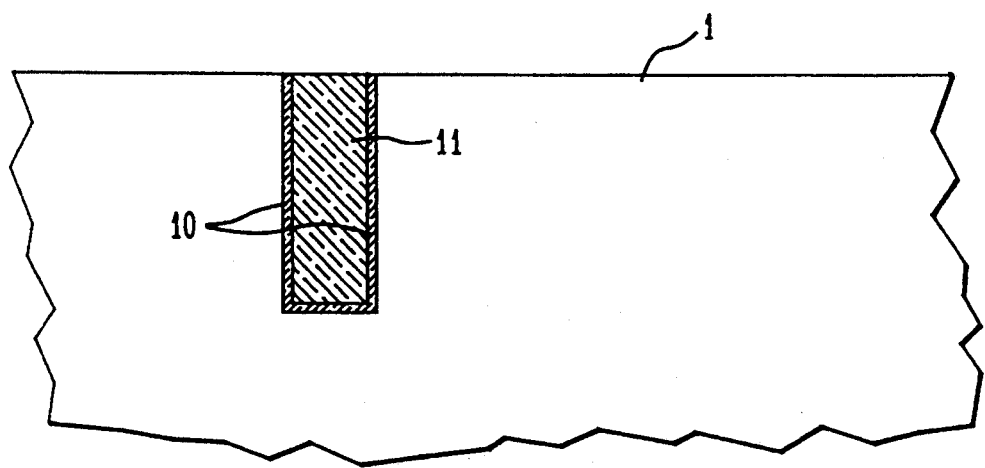

Trenches are then refilled with poly (node 11) and planarized, as shown in FIG. 5. To fill the trench 30 with silicon, silicon layers are repeatedly deposited on the entire structure at low temperature and low pressure to avoid the formation of voids, until the trench has been filled. The silicon on the upper surface of the substrate is then electro-mechanically polished, and etched to form the structure of FIG. 5. Alternatively, after the repeated blanket deposition of poly, during which an indentation will form on the upper surface corresponding to the location of the hole 30, the indentation can be filled with a photo-resist material, and the entire layer of silicon, together with the photo-resist, can be RIE'ed.

Next, collars 31 are formed. To do this, the upper portion of the polysilicon forming the storage node 11 is first etched by RIE to recess the poly to a desired depth. Next, oxide is deposited on the entire surface of the device, masked, and anisotropically RIE'd to leave the oxide only on the horizontal surfaces of the hole 30. The oxide layer on the horizontal surfaces forms collar 31. The hole is then filled with poly silicon again and planarized.

Figure 6:
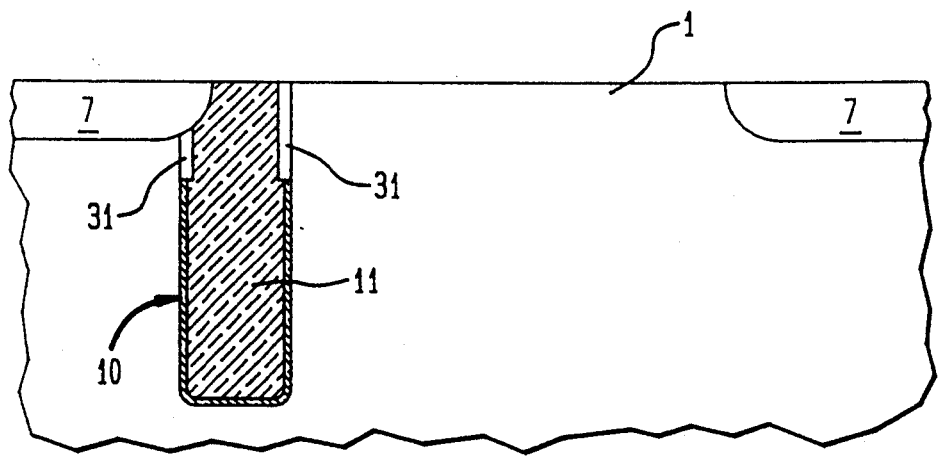

Next, LOCOS 7, which provides device isolation, is formed by recessing the silicon in the desired location of LOCOS 7 and oxidizing the recess.. Alternatively, a shallow trench can be etched in the desired location of LOCOS 7 and the trench filled with oxide. The latter technique, known as shallow trench isolation, is preferred. At this point, the structure is as shown in FIG. 6.

Figure 7:
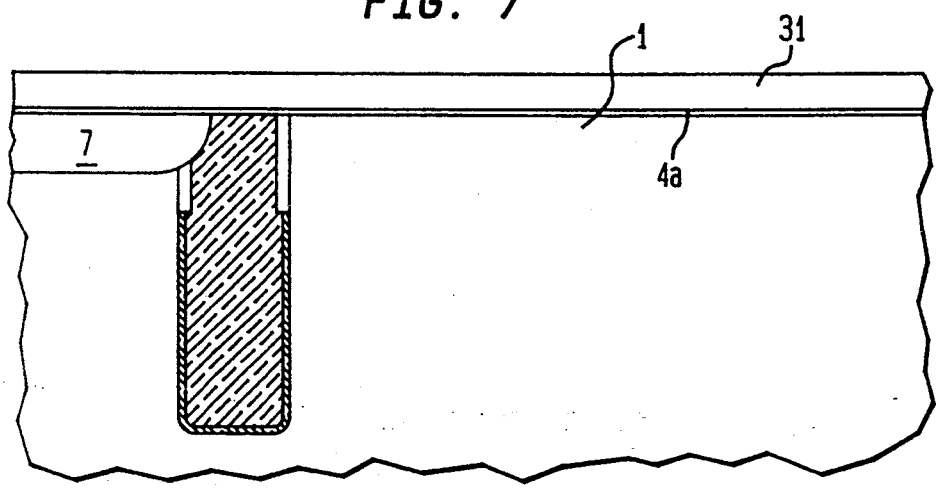
Figure 8:
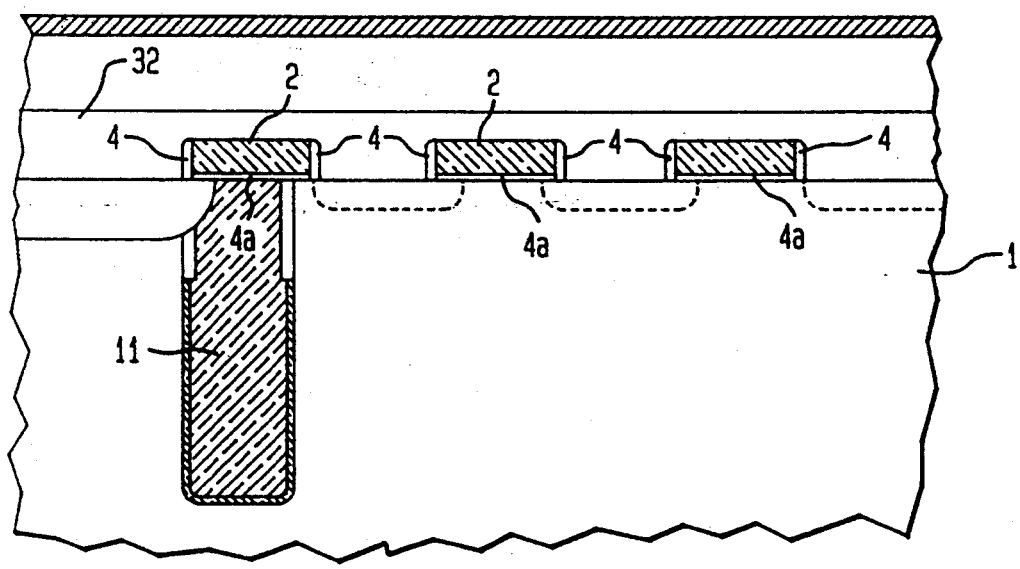

Next, referring to FIG. 7, gate oxide layer 4a is formed by blanket oxidation, followed by gate poly layer 31 deposition and patterning to form gate poly 2, as shown in FIG. 8. Diffusion area 13 is then produced by phosphorous ion implantation. Oxide spacers 4 are then formed to the gate poly by depositing a thin layer of oxide on the device and anisotropically RIE'ing the oxide to leave the oxide spacers on the horizontal surfaces of the poly contacts 2.

Figure 8A:
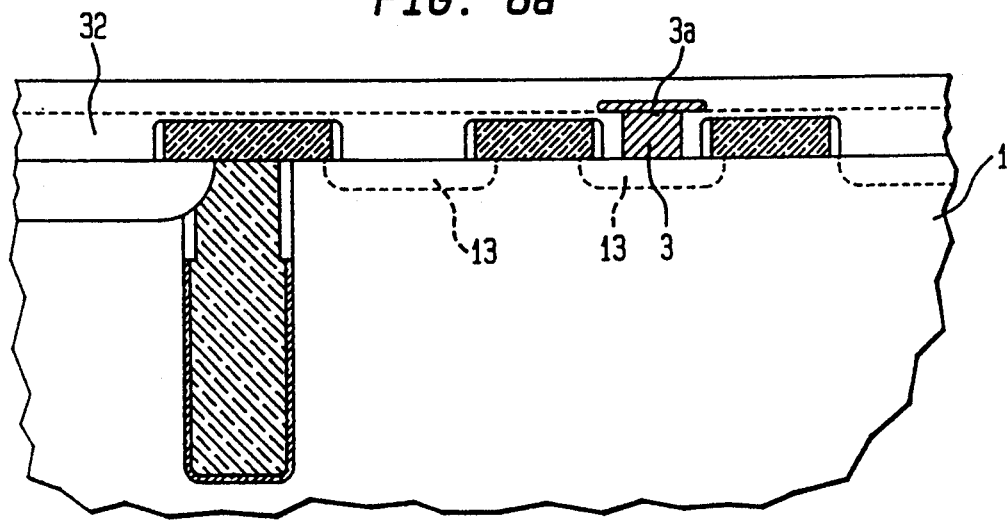
Figure 9:
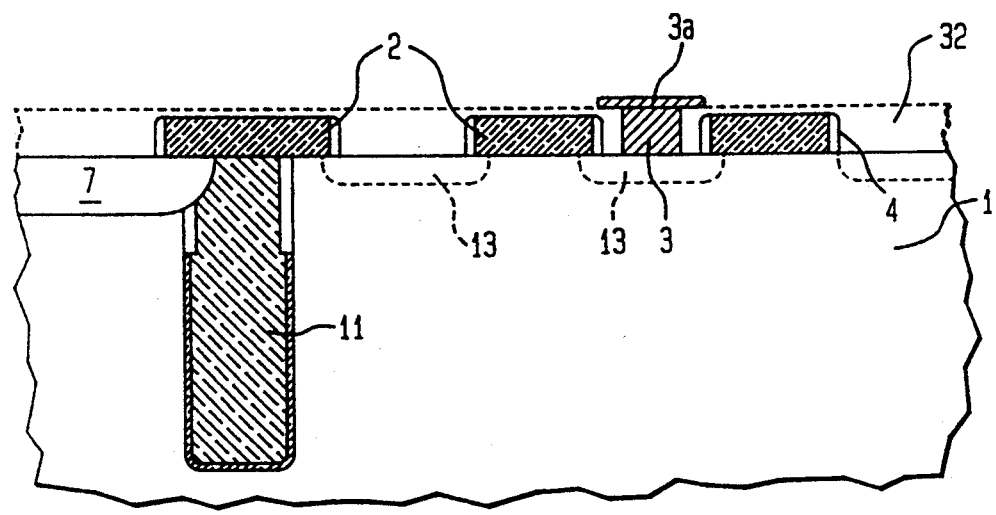

A layer of TEOS 32 is deposited next and etched above diffusion area 13 in the region in which contact 3 is desired. The etched region is then filled with metal to form contact 3, as shown in FIG. 8a, followed by ground line 3a patterning, resulting in the structure of FIG. 9.

Figure 10:
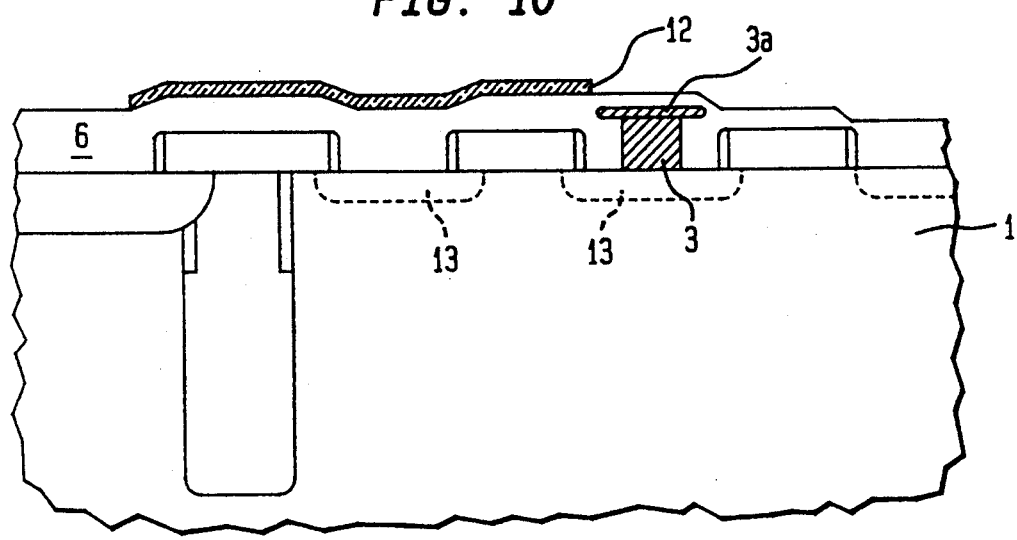
Figure 11:
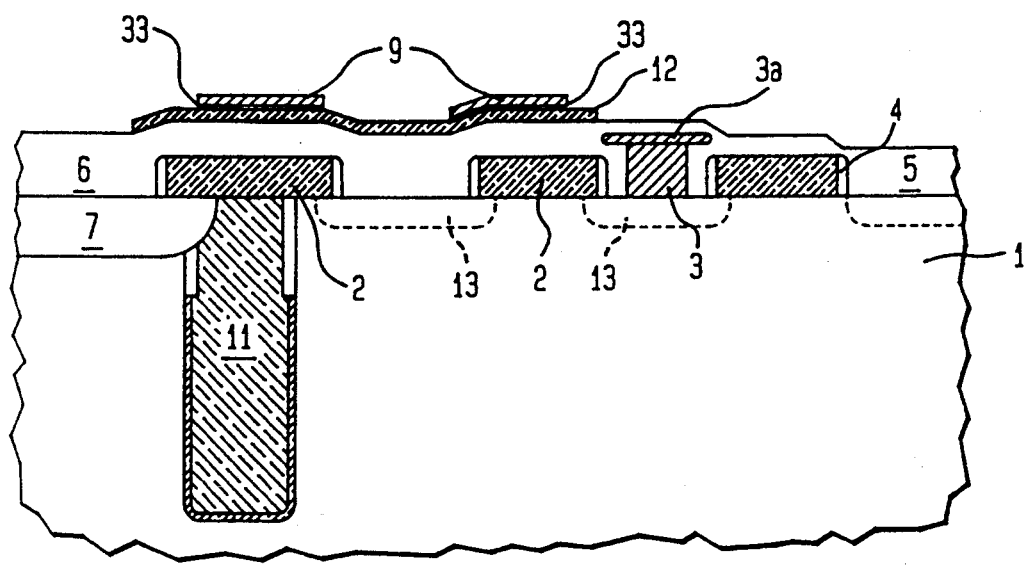

Next, as shown in FIG. 10, another layer of TEOS 6 is deposited to isolate the ground line 3a and contact 3, followed by the deposition and patterning of TFT gate poly 12 by depositing and patterning. Gate oxide 33, shown in FIG. 11, is formed on the TFT gate poly 12 by oxidization, and then TFT body poly 9 is deposited and patterned.

Figure 12:
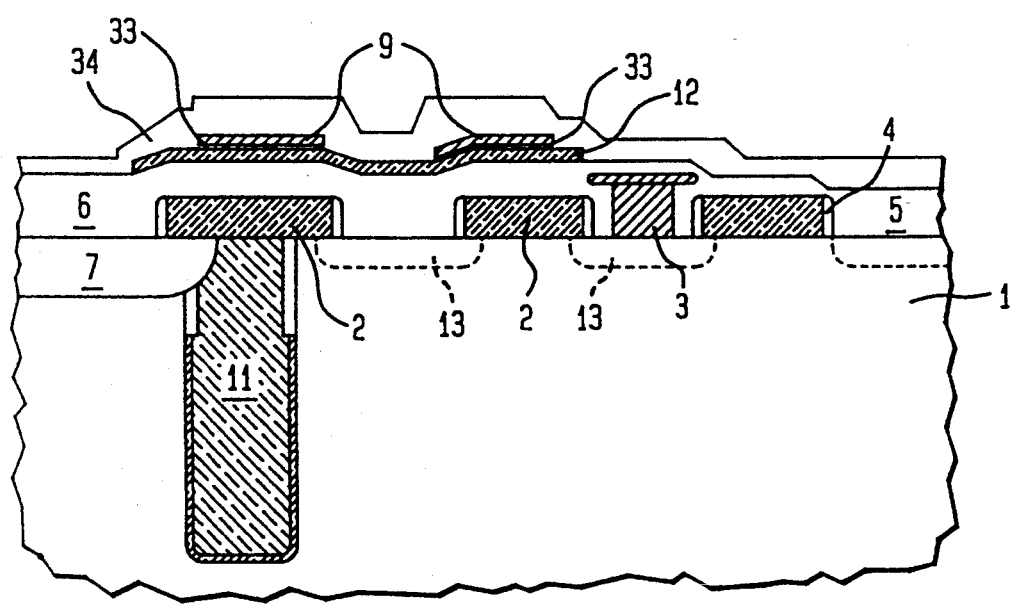
Figure 13:
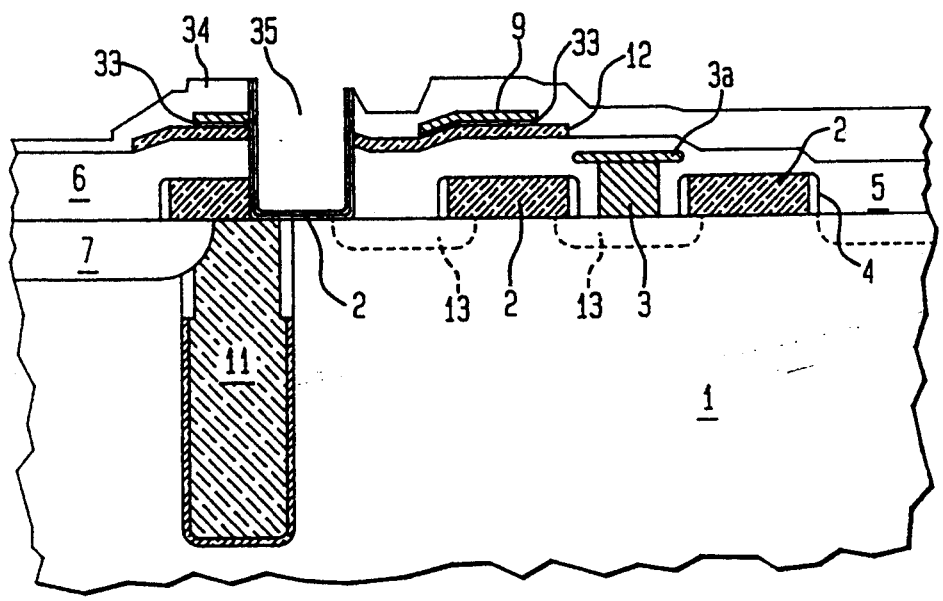

A layer of TEOS 34 is then blanketly deposited, as shown in FIG. 12. Trench contact hole 35 is patterned and sequentially anisotropically RIE'ed through the various layers to stop finally on the substrate 1. Next, boron ion implantation is performed at the bottom of hole 35 to extend the diffusion area 13 for better contact with the bottom of the contact 8. Hole 35 is then lined with $TiSi_2$ and TiN 14 and 15 before being filled with poly or metal, as shown in FIG. 1. Contact 8 is then patterned to contact TFT body poly 9 and power supply (VDD) wiring.

Referring now to FIG. 14, a schematic of an SRAM cell in accordance with the invention will be described. The cell comprises p-type devices 100 and 101, and n devices 102 and 103. Also provided are n-type access devices 104 and 105. During a write operation, the access devices 104 and 105 are on and the data is written into the cell. During a read operation, again the devices 104 and 105 are on and the sense amplifier is set as per the data stored in the cell. The storage node 120 corresponds to the vertical contact 8 of FIG. 1. The storage node connects diffusion contact 111 (corresponding to 9 in FIG. 1), the gate contact 112 (corresponding to 12 in FIG. 1), diffusion contact 113 (corresponding to one diffusion area 13 in FIG. 1), another diffusion contact 114 (corresponding to another diffusion area in FIG. 1), and trench capacitor 115a (corresponding to the polysilicon plate 11 in FIG. 1). 110a is the ground.

The operation of the circuit of FIG. 14 is as follows. When the input BL is High (and hence BL bar is low), data will be read into the cell when the gates of transistors 104 and 105 go high. The storage node 122 will go high because BL bar is low, turning on transistor 100 and turning off transistor 102. This will cause node 122 to rise to a potential of $V_{DD}$. At the same time, the high input from access transistor 122 will turn transistor 101 off and transistor 103 on, placing node 120 at ground potential.

While the invention has been described particularly with respect to preferred embodiments thereof, it will be understood by those skilled in the art that modifications can be made without departing from the spirit and scope of the invention.

I claim:

1. An SRAM cell, comprising:
    a substrate;
    a capacitor formed in the substrate;
    a first diffusion area in the substrate adjacent the capacitor;
    a first gate node contacting the capacitor;
    a second diffusion area in the substrate spaced from the first diffusion area;
    a second gate node disposed above and electrically isolated from the first and second diffusion areas;
    a third gate node disposed above and electrically isolated from the second diffusion area;
    a contact contacting the second diffusion area and electrically isolated from the first and second gate nodes;
    a first insulator layer on the first, second and third gate nodes, the contact and the exposed surface of the substrate;
    a polysilicon gate layer formed on the first insulator layer;
    a polysilicon body disposed above and electrically isolated from the polysilicon gate layer;
    a single contact electrically connecting the capacitor to each of the first diffusion area, the first gate node, the polysilicon gate layer and the polysilicon body, thereby forming a latch node of the cell.

2. The SRAM cell of claim 1, wherein the substrate has an upper surface and the single contact is vertically disposed with respect to the upper surface of the substrate.

3. The SRAM cell of claim 2, wherein the second trench is lined with a diffusion barrier layer.

4. The SRAM cell of claim 1, wherein the capacitor comprises:
    a trench formed in the substrate;
    a dielectric material lining the trench;
    a plate material in the trench.

5. The SRAM of claim 1, wherein the gate layer is a thin film transistor gate layer, and the body is a thin film body.

6. The SRAM cell of claim 1 further comprising a LOCOS isolation region in the substrate adjacent the capacitor but not contacting the first diffusion area.

7. An SRAM cell, comprising:
    a substrate;
    a first insulator layer on the surface of the substrate;
    a trench capacitor formed in the substrate;
    a first diffusion area in the substrate adjacent the trench capacitor;
    a first gate node on the first insulator layer and disposed above the trench capacitor;
    a second diffusion area in the substrate spaced from the first diffusion area;
    a second gate node on the first insulator layer and disposed above the surface of the substrate contacting the first and second diffusion areas;
    a third gate node on the first insulator layer and disposed above the surface of the substrate contacting the second diffusion area;
    a contact contacting the second diffusion area and electrically isolated from the first and second gate nodes;
    a second insulator layer on the first, second and third gate nodes, the contact and the exposed surface of the substrate;
    a polysilicon gate layer formed on the insulator layer;
    a third insulator layer on the gate layer;
    a polysilicon body formed on the third insulator layer and disposed above the gate layer;
    a contact electrically connecting the trench capacitor node to each of the first diffusion area, the first gate node, the gate layer and the body.

8. The SRAM cell of claim 7, wherein the contact is vertically disposed.

9. The SRAM cell of claim 8, wherein the contact is disposed in a second trench, and wherein the second trench is lined with a diffusion barrier layer.

10. The SRAM cell of claim 8, further comprising a LOCOS isolation region in the substrate adjacent the capacitor but not contacting the first diffusion area.

11. An SRAM cell, comprising:
    a substrate;
    a first diffusion area in the substrate;
    a first gate node disposed above and electrically isolated from the first diffusion area;
    a second diffusion area in the substrate spaced from the first diffusion area;
    a second gate node disposed above and electrically isolated from the first and second diffusion areas;
    a third gate node disposed above and electrically isolated from the second diffusion area;
    a contact on the second diffusion area and electrically isolated from the first and second gate nodes;
    a gate layer above and electrically isolated from the first and second gate nodes;
    a body disposed above and electrically isolated from the gate layer;
    a single contact electrically connecting the first diffusion area, the first gate node, the gate layer and the body, the single contact substantially surrounded by means for preventing diffusion between elements in contact with the contact, and for preserving the polarity of the elements.

12. The cell of claim 11, further comprising means for introducing a capacitance between the single contact and ground, whereby to improve the stability of the cell.

13. The cell of claim 11, wherein the single contact is vertically disposed.

14. The cell of claim 12, wherein the means for introducing a capacitance comprises a capacitor disposed between the single contact and ground.

15. The cell of claim 14, wherein the capacitor lies in a trench in the substrate between the single contact and ground.

16. The cell of claim 11, wherein the diffusion preventing means comprises a diffusion barrier layer surrounding the contact.

* * * * *